United States Patent
Gorbatov et al.

(10) Patent No.: US 7,818,594 B2
(45) Date of Patent: Oct. 19, 2010

(54) POWER EFFICIENT RESOURCE ALLOCATION IN DATA CENTERS

(75) Inventors: Eugene Gorbatov, Hillsboro, OR (US); Canturk Isci, Lawrenceville, GA (US); Ripal Nathuji, Princeton, NJ (US)

(73) Assignee: Intel Corporation, Santa Clara, CA (US)

( * ) Notice: Subject to any disclaimer, the term of this patent is extended or adjusted under 35 U.S.C. 154(b) by 729 days.

(21) Appl. No.: 11/726,218

(22) Filed: Mar. 21, 2007

(65) Prior Publication Data

US 2008/0234873 A1    Sep. 25, 2008

(51) Int. Cl.
| | |
|---|---|
| G06F 1/26 | (2006.01) |
| G06F 1/32 | (2006.01) |
| G05B 13/02 | (2006.01) |
| G05D 3/12 | (2006.01) |
| G05D 5/00 | (2006.01) |
| G05D 9/00 | (2006.01) |
| G05D 11/00 | (2006.01) |
| G05D 17/00 | (2006.01) |

(52) U.S. Cl. .................... 713/320; 700/31; 700/32; 700/291

(58) Field of Classification Search ................ 713/320; 700/31, 32, 291
See application file for complete search history.

(56) References Cited

U.S. PATENT DOCUMENTS

| | | | |
|---|---|---|---|
| 2005/0055590 A1* | 3/2005 | Farkas et al. ............. 713/320 |
| 2005/0228618 A1* | 10/2005 | Patel et al. ............. 702/188 |
| 2006/0259621 A1* | 11/2006 | Ranganathan et al. ....... 709/226 |
| 2007/0250838 A1* | 10/2007 | Belady et al. ............. 718/105 |

* cited by examiner

*Primary Examiner*—Thomas Lee
*Assistant Examiner*—Brandon Kinsey
(74) *Attorney, Agent, or Firm*—Trop, Pruner & Hu, P.C.

(57) ABSTRACT

A data center may be operated to achieve reduced power consumption by matching workloads to specific platforms. Attributes of the platforms may be compiled and those attributes may be used to allocate workloads to specific platforms. The attributes may include performance attributes, as well as power consumption attributes.

8 Claims, 1 Drawing Sheet

POWER EFFICIENT RESOURCE ALLOCATION IN DATA CENTERS

BACKGROUND

This relates generally to data centers.

Data centers are centers where a number of servers reside to implement data processing. For example, a number of servers may be provided to send and receive information to support various websites and other data intensive operations.

Power management has become an increasingly active research area for modern computing systems. While most of this interest focuses on mobile platforms, more recently it has become clear that power management is also of critical importance in enterprise environments. Trends towards consolidation and higher density, enabled by virtualization in new small form factor server blades, and the traditional drive for higher performance have led to increased power and cooling requirements in data centers. These characteristics elevate ownership costs and put more pressure on rack and enclosure densities, demanding new approaches to data center management that can enable more power efficient execution of enterprise workloads.

DETAILED DESCRIPTION

Figure 1:
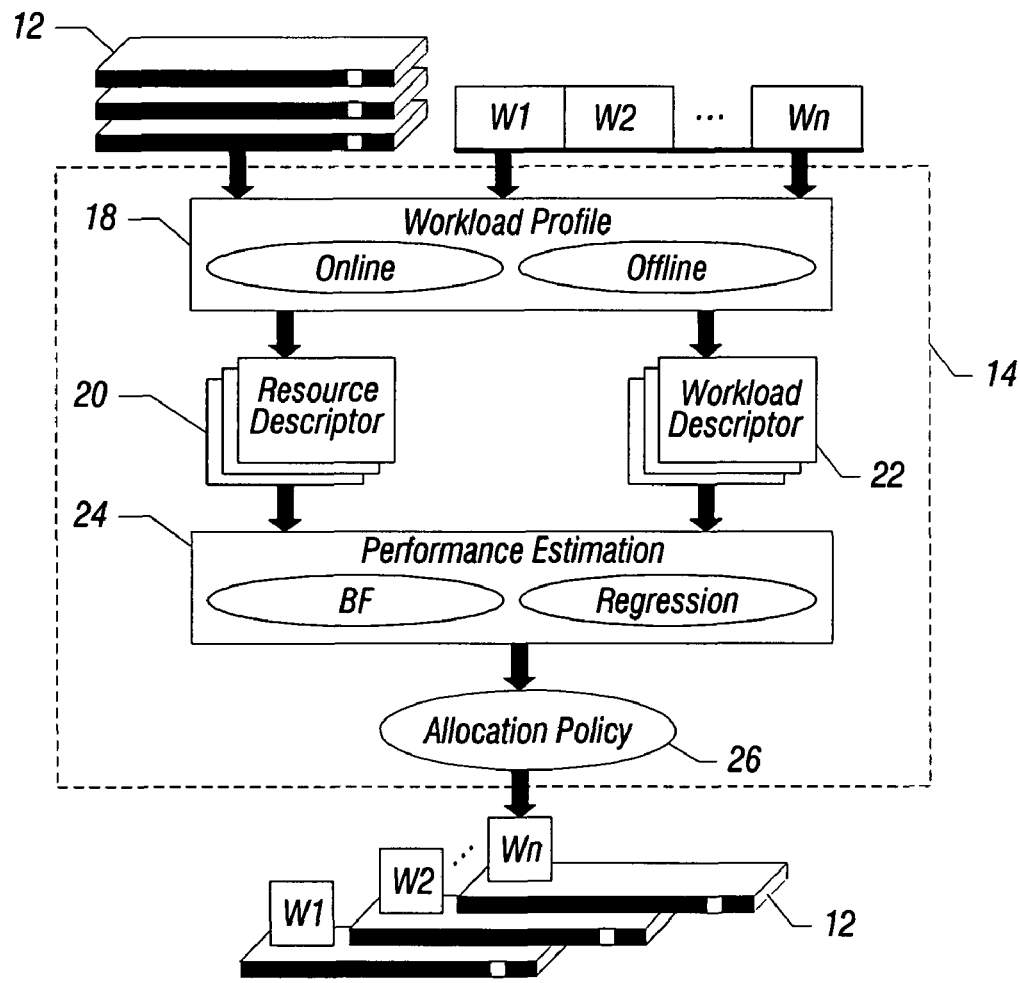
FIG. 1 is a schematic depiction of one embodiment of the present invention.

Data centers commonly exhibit platform heterogeneity. This heterogeneity stems from the architectural and management capability variations of the underlying platforms in a data center. This heterogeneity may arise from a number of sources, but may simply be the result of the fact that, over time, progressively advanced platforms may be acquired with increasingly improved power conservation and other characteristics. Thus, one heterogeneity that exists is due to the fact that the data center may include a large number of platforms that were purchased at different times with different capabilities and different technology levels.

In accordance with one embodiment, an allocator efficiently allocates workloads to the best fitting platforms to improve the power efficiency of the whole data center. The allocation may be performed by employing analytical prediction layers that can accurately predict workload power/performance across platform architectures and power management capabilities.

Modern data centers incorporate a variety of platforms with different power/performance tradeoffs. This is due to the incremental replacement and growth cycles, typical of data centers. The platforms in data centers not only vary in terms of their performance and power profile, but they also provide different degrees of power management capabilities. While some systems, especially older generation platforms, only provide rudimentary power management features, such as system sleep states or processor performance states, newer platforms include a richer set of power management functionality, including memory power and thermal control, enhanced processor power management, and aggressive idle states.

In addition, as data centers environments embrace and deploy virtualization solutions, enterprise workloads become significantly more diverse and heterogeneous too, placing a wide range of requirements on the underlying infrastructure. Taking advantage of this heterogeneity and platform power management capability at the data center level enables increased energy efficiency in the enterprise.

Workload to resource allocation is currently primarily focused on balancing the demand across the resources. These existing methods base their decisions on utilization information or stripe workloads across resources in a round robin fashion. However, energy efficiency of the whole data center may be improved by allocating the heterogeneous resources based on their power/performance tradeoffs. By matching workload requirements and execution behavior to the underlying power characteristics of physical resources and their power management capabilities, significant improvements in data center energy efficiency may be achieved.

This power-aware allocation policy is composed of a performance estimation layer that guides an allocation layer. The performance estimation layer uses derived workload and platform descriptors to predict workload behavior on different platforms of the data center. As used herein, "workload" is any task or group of tasks to be handled by a platform. Then, the allocator feeds these estimates into its allocation policies and determines the most energy efficient platform for the given workload and performance level. In this way, the workloads are deployed into different platforms under devised energy efficiency criteria.

Referring to FIG. 1, a plurality of platforms 12 may be scheduled to handle a number of workloads W1-Wn. A control or allocator 14 may include a plurality of components. The control may be implemented in hardware or software and may be part of one or more platforms 12 or may be a dedicated unit. The workload profile 18 is based on information about the platforms 12 and about the workloads W1-Wn. The workload profile 18 is developed by having platforms specify their power consumption characteristics. As used herein, power consumption characteristics encompass rated power consumption, types of thermal management solutions, such as fans, coolers, and heat sinks, environmental conditions, such as local platform ambient temperature, and power management capabilities and features. At the same time, workloads may provide their execution characteristics through online or offline profiling on a subset of platforms.

The workload profile is then used to develop resource descriptors 20 and workload descriptors 22. Partial resource and workload descriptors are constructed through online or offline profiling. The descriptors provide power performance characteristics for a subset of workload and physical resources. Next, a performance estimation 24 is undertaken. It may use blocking factor (BF) or regression analyses. Specifically statistical or analytical models are used to predict workload power/performance characteristics across all platforms. The prediction is derived from partial resource and workload descriptors, generated through online or offline profiling. The use of either analytical, such as best fit, or statistical, such as regression, approaches may depend on the usage model.

The performance estimation is used to derive the allocation policy 26. The allocation policy matches workload and resource characteristics provided by descriptors to increase power efficiency of the underlying hardware platforms. As a result, the workloads W1-Wn are matched to specific platforms 12.

Performing intelligent mappings between applications and underlying platforms for execution may involve a variety of information. The platform descriptors may be made up of component declarations and component parameters. For example, the processor component on a server may be declared and described with parameters such as architecture family and frequency. Similarly, workload descriptors may consist of attribute declarations and component-based attribute values. In particular, attribute values, defined in these descriptors, may be associated with component metadata outlining the type of component to which they apply. For example, a workload descriptor may declare cache misses per instruction (MPI) as an attribute. The value of this attribute depends upon the parameters of the memory component assumed, such as the size of the cache. Therefore, any definitions of this attribute are associated with: (1) a component type which correlates to a declaration in a platform descriptor and (2) a list of component parameters that restrict where this value should be applied. If the parameter list is empty, the attribute value can be applied to all platforms. This approach allows an attribute to be defined multiple times, with varying degrees of applicability to a particular component instantiation for a platform.

Given the use of descriptors as an input to the allocation scheme, the issue arises as to where the information is obtained. Platform component parameters may be obtained via basic input/output system mechanisms in the platform, currently used by traditional management systems to obtain hardware information. Workload descriptor attribute values are more complicated since they vary across systems. One approach is to make values available via workload profiling across all types of platforms. This approach may be viable for data centers where the applications are known a priori and there is a limited amount of heterogeneity. On the other hand, for service oriented data centers, where workloads may be submitted at runtime, the descriptor attribute values may be determined online. For scalability, in many data center environments that may involve measuring attribute values on a small set of platforms and then predicting the remaining values.

The attribute values may be defined conditioned upon component descriptions. This allows efficient estimation of attribute values when necessary by profiling workloads on a subset of systems wherein the global heterogeneity can be captured in the component permutations of the smaller set. This approach may be termed "component-based attribute prediction." As an example, performance of a central processing unit bound workload can be represented as a function of its central processing unit and memory behavior:

$$CPI = CPI_{core} + MPI*Latency*BF$$

Where CPI is cycles per instruction, MPI is memory accesses per instruction, latency is memory access latency, and BF is processor blocking factor. The first part of this equation reflects micro-architecture execution characteristics, while the second part of the equation represents performance of a memory subsystem. This type of performance characterization can be used for cross-platform performance prediction. In other words, if workload performance is available for all the components in the platform, its performance can be accurately predicted as a combination of component level performance parameters, even though the workload has not been profiled on the platform.

Figure 2:
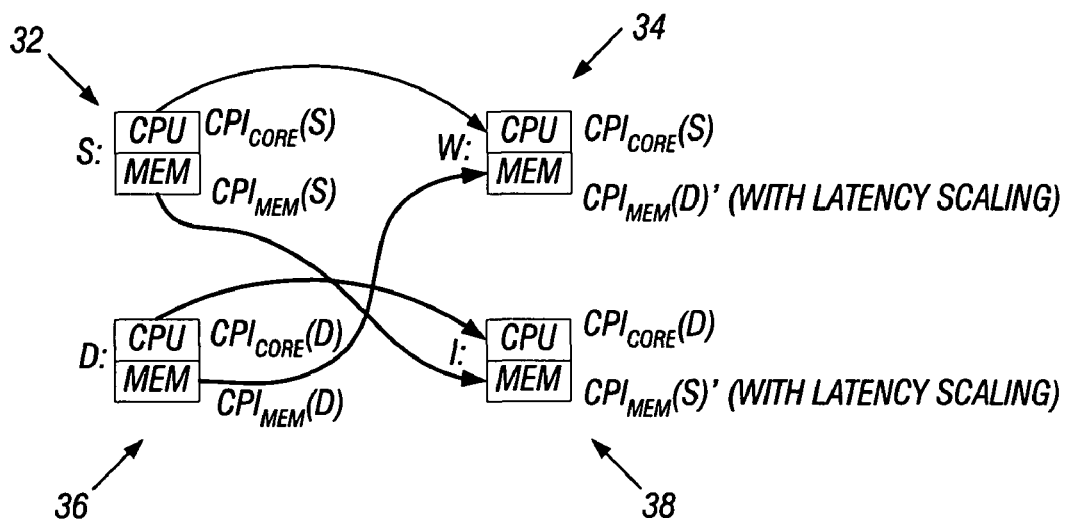
FIG. 2 is a flow diagram showing one implementation of a component-based attribute prediction in accordance with one embodiment of the present invention.

FIG. 2 provides an example in which a workload is profiled on two systems, S and D, each with a processor (CPU) and memory (MEM) having CPI values that have different processor and memory architectures. Component attributes obtained in this profiling are then used to predict workload performance on two other systems, W and I, where W has processor architecture similar to that of system S and the memory architecture is similar to that of system D. I has a processor architecture from system D and a memory architecture from system S.

Once workload and resource descriptors are obtained, the allocation policy distributes the workload to reduce the overall power consumption, while meeting performance requirements of each workload.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A computer readable medium storing instructions to enable a computer to:
    operate a data center including a plurality of platforms;
    handle a plurality of workloads on the plurality of platforms;
    allocate the workloads among the platforms of the data center based, at least in part, on the power consumption characteristics of said platforms to reduce the power consumption of the data center;
    obtain information about the power consumption characteristics of components of a plurality of platforms, said components being less than an entire platform; and
    predict a power consumption characteristic of one platform based on power consumption characteristics of components of other platforms.

2. The medium of claim 1 further storing instructions to obtain information about the execution characteristics of a workload.

3. The medium of claim 1 further storing instructions to match a characteristic of a memory of one platform with a power consumption characteristic of a memory of another platform.

4. The medium of claim 3 further storing instructions to match a characteristic of a processor on one platform with respect to power consumption to a characteristic of a processor on another platform with respect to power consumption.

5. A data center comprising:
    a plurality of platforms;
    and
    an allocator to match a workload to a platform based, at least in part, on a power consumption characteristic of the platform and a characteristic of the workload;
    the allocator to predict a power consumption characteristic of one platform based on a characteristic of another platform.

6. The center of claim 5, said allocator to match an execution characteristic of said workload to a platform.

7. The center of claim 5, said allocator to match a power consumption characteristic of a memory on one platform to a characteristic of a memory of another platform.

8. The center of claim 7, said allocator to match a power consumption characteristic of a processor on one platform to a power consumption characteristic of a processor on another platform.

* * * * *